United States Patent
Toyama et al.

(10) Patent No.: US 7,915,060 B2
(45) Date of Patent: Mar. 29, 2011

(54) GRID ARRAY CONNECTION DEVICE AND METHOD

(75) Inventors: Munehiro Toyama, Tsukuba (JP); Siew Fong Tai, Selangor (MY); Kian Sin Sim, Penang (MY); Charan K. Gurumurthy, Higley, AZ (US); Selvy Tamil Selvamuniandy, Kedah (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/714,310

(22) Filed: Feb. 26, 2010

(65) Prior Publication Data

US 2010/0148365 A1 Jun. 17, 2010

Related U.S. Application Data

(62) Division of application No. 11/167,922, filed on Jun. 27, 2005, now Pat. No. 7,670,951.

(51) Int. Cl.
*H01L 21/00* (2006.01)
*H01L 23/48* (2006.01)

(52) U.S. Cl. .......................................... 438/22; 257/780

(58) Field of Classification Search ........................ None
See application file for complete search history.

(56) References Cited

U.S. PATENT DOCUMENTS

| | | | |
|---|---|---|---|
| 5,821,627 A * | 10/1998 | Mori et al. | 257/780 |
| 6,358,630 B1 * | 3/2002 | Tsukada et al. | 428/646 |
| 6,782,610 B1 | 8/2004 | Iijima et al. | |
| 7,344,903 B2 * | 3/2008 | Erchak et al. | 438/29 |
| 7,535,095 B1 * | 5/2009 | En et al. | 257/701 |
| 7,670,951 B2 | 3/2010 | Toyama et al. | |
| 2001/0020546 A1 | 9/2001 | Eldridge et al. | |
| 2002/0117330 A1 | 8/2002 | Eldridge et al. | |
| 2004/0020045 A1 | 2/2004 | Hirano | |
| 2005/0003677 A1 * | 1/2005 | Dean et al. | 438/754 |
| 2005/0150683 A1 | 7/2005 | Farnworth et al. | |
| 2006/0292737 A1 | 12/2006 | Toyama et al. | |

OTHER PUBLICATIONS

"U.S. Appl. No. 11/167,922 Non-Final OA mailed Jul. 2, 2007".
"U.S. Appl. No. 11/167,922 Response filed Feb. 26, 2008 to Final Office Action mailed Dec. 26, 2007", 8 pages.
"U.S. Appl. No. 11/167,922 Notice of Allowance Mailed Oct. 8, 2009", 9.
"U.S. Appl. No. 11/167,922, Final Office Action mailed May 22, 2009", 9 pgs.
"U.S. Appl. No. 11/167,922 Final Office Action mailed Dec. 26, 2007", 9 pgs.
"U.S. Appl. No. 11/167,922 Response filed Oct. 2, 2007 in response to Non-Final Office Action mailed Jul. 2, 2007", 9 pgs.
"U.S. Appl. No. 11/167,922 Non-Final Office Action mailed Sep. 15, 2008.", 8 pgs.

* cited by examiner

*Primary Examiner* — Charles D Garber
*Assistant Examiner* — André C Stevenson
(74) *Attorney, Agent, or Firm* — Schwegman, Lundberg & Woessner, P.A.

(57) ABSTRACT

A method and device for input/output connections is provided. Devices and methods for connection structure are shown with improved mechanical properties such as hardness and abrasion resistance. Land grid array structures are provided that are less expensive to manufacture due to reductions in material cost such as gold. Ball grid array structures are provided with improved resistance to corrosion during fabrication. Ball grid array structures are also provided with improved mechanical properties resulting in improved shock testing results.

7 Claims, 6 Drawing Sheets

GRID ARRAY CONNECTION DEVICE AND METHOD

RELATED APPLICATION

This application is a divisional of U.S. application Ser. No. 11/167,922, filed Jun. 27, 2005, now U.S. Pat. No. 7,670,951 which is incorporated herein its entirety by reference.

TECHNICAL FIELD

The present invention relates generally to electronic connection structures. In particular, the present invention relates to devices and methods for grid array connection structures between chip packages and circuit boards.

BACKGROUND

Semiconductor chips such as processor chips are housed in chip packages, which are subsequently attached to circuit boards in the manufacture of a number of electronic devices. These devices, include personal computers, handheld computers, mobile telephones, and other numerous information processing devices. One common configuration of input/output connections between chip packages and adjacent circuit boards includes grid array connection structures. Examples of such connection structures include land grid array structures and ball grid array structures.

There are a number of design concerns that are taken into account when forming grid arrays. High mechanical strength and reliability of the grid array connections are desirable. Some devices, for example mobile telephones, are frequently subject to high shock if a user drops their telephone. Other design concerns include ease of manufacturability, and low manufacturing cost.

DETAILED DESCRIPTION

Figure 1:
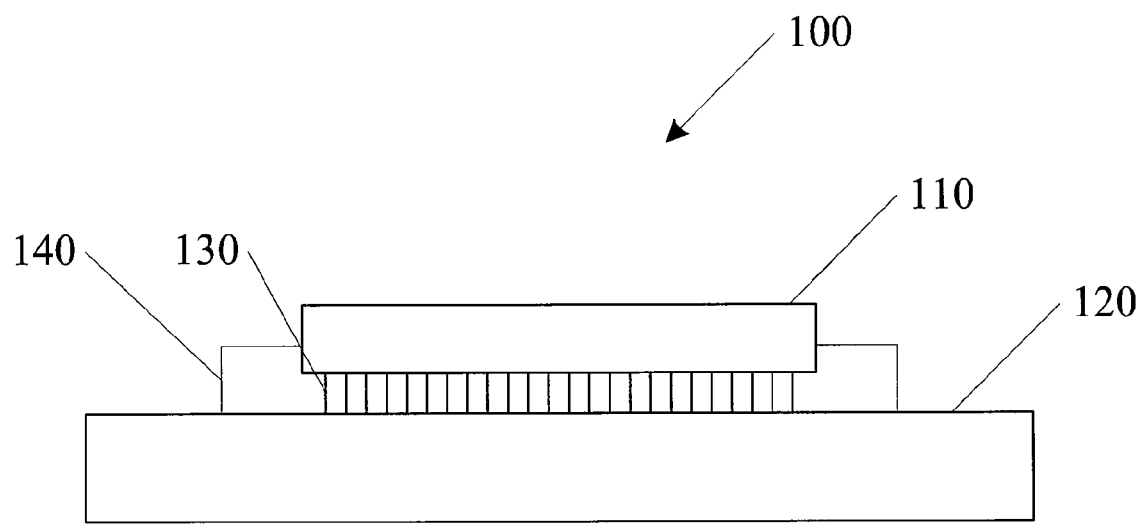
FIG. 1 illustrates a chip assembly according to one embodiment of the invention.

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes, etc. may be made, without departing from the scope of the present invention. The following detailed description is, therefore, not to be taken in a limiting sense, and the scope of the invention should be determined with reference to the appended claims, along with the full scope of equivalents to which such claims are entitled. The drawings are not drawn to scale unless specifically noted.

FIG. 1 shows a chip assembly 100. A chip package 110 is shown mounted to an adjacent circuit board 120. In one embodiment, as shown in FIG. 1, a grid array socket 140 is included with a number of input/output connections 130 located between the chip package 110 and the circuit board 120. In one embodiment, the grid array socket 140 includes a land grid array socket.

Figure 2:
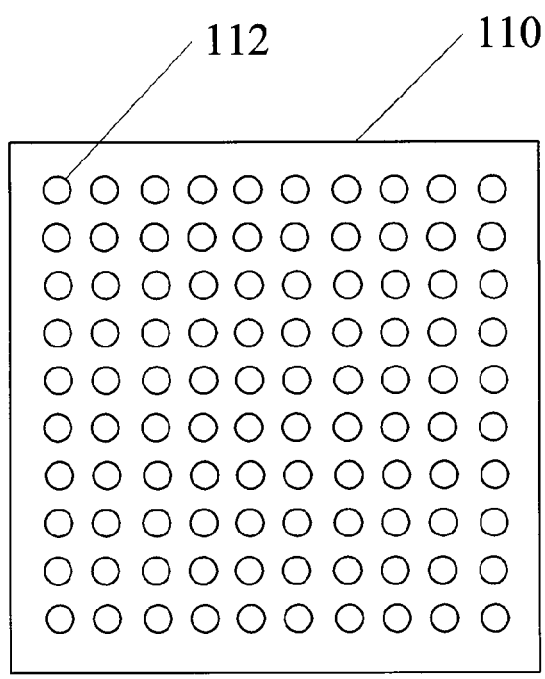
FIG. 2 illustrates an input/output grid array according to one embodiment of the invention.

FIG. 2 shows a bottom side of the chip package 110. A mating half 112 of a number of chip connection structures is shown on the chip package 110. In one embodiment, the mating halves 112 include land grid array pad surfaces. In one embodiment, the mating halves 112 include ball grid array structures such as solder balls. In one embodiment, mating halves 112 make up a portion of input/output connections 130 as shown in FIG. 1.

Figure 3A:
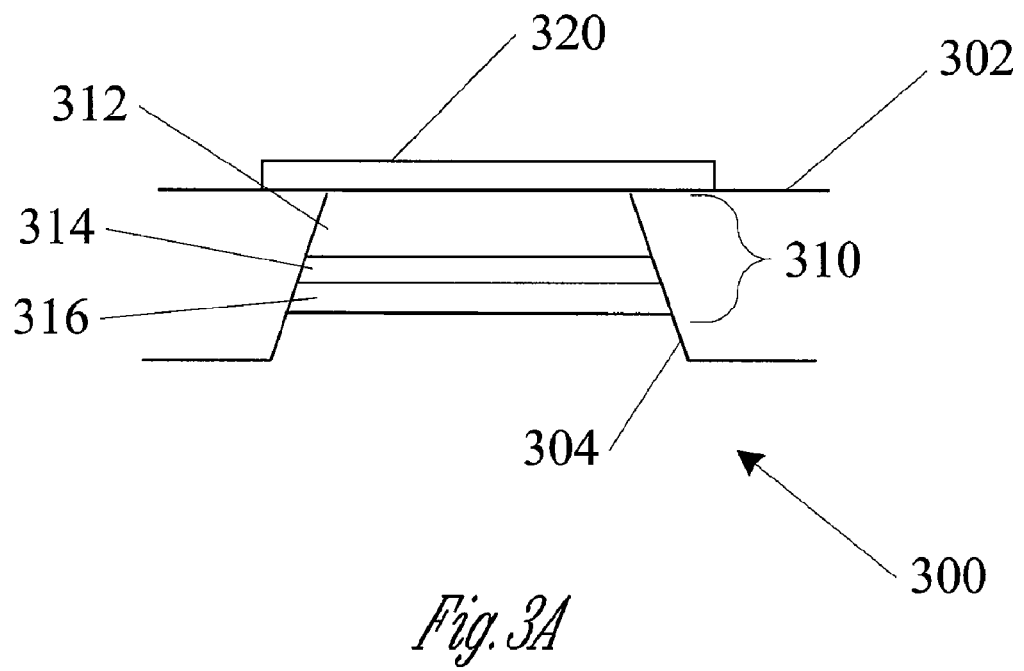
FIG. 3A illustrates an input/output structure according to one embodiment of the invention.

FIG. 3A shows a land grid array structure 300. In one embodiment, the land grid array structure is included in at least one of the mating halves 112 on a chip package 110 as shown in FIG. 2. As will be discussed in more detail below, in one embodiment, an input/output connection between a chip package and an adjacent circuit board includes a land grid array structure 300 and a land grid array pin (330 in FIG. 3B) that forms an electrical contact with the land grid array structure 300.

FIG. 3A shows a portion of a chip package 302 with an electrical connection structure 320. In one embodiment, the electrical connection structure 320 is located adjacent to an opening 304 in the chip package 302. In one embodiment, the electrical connection structure 320 includes a metallic connection surface, for example a copper or copper containing surface. Further shown in FIG. 3A are interface layers 310. A first layer 312, a second layer 314, and a third layer 316 are shown in FIG. 3A.

In one embodiment the first layer 312 includes nickel. In one embodiment the first layer 312 includes nickel and phosphorous. In one embodiment, the nickel in the first layer 312 is deposited on the electrical connection structure 320 using electroless deposition techniques. In one embodiment, the electroless deposition uses a chemical reaction to deposit the first layer 312, which results in an alloy of nickel and phosphorous deposited as the first layer 312. In one embodiment, the first layer is deposited to a thickness of between 5 and 8 μm.

In one embodiment, the second layer 314 includes palladium. In one embodiment, the second layer includes palladium and phosphorous. In one embodiment, the palladium in the second layer 314 is deposited on the first layer 312 using electroless deposition techniques. In one embodiment, the electroless deposition uses a chemical reaction to deposit the second layer 314, which results in an alloy of palladium and phosphorous deposited as the second layer 314.

In one embodiment, the second layer 314 is deposited to a thickness of approximately 100 nm. In one embodiment, the second layer is substantially amorphous. In one embodiment, the second layer is substantially amorphous on a nanometer scale dimension. Advantages of a amorphous microstructure include increased hardness over alternative crystalline structures. Increased hardness allows a deposited layer to be deposited thinner than alternative crystalline layers, while maintaining desired mechanical characteristics. If desired, an amorphous layer can be deposited to similar thicknesses of crystalline layers with improved mechanical characteristics. In one embodiment, the amorphous microstructure is substantially non-porous. A non-porous microstructure provides a further advantage of a continuous barrier layer over underlying structure such as the first layer 312. Continuous, or non-porous layers help to prevent corrosion of underlying structure such as nickel in an embodiment of the first layer 312.

In one embodiment, the third layer 316 includes gold. In one embodiment, the gold in the third layer 316 is deposited on the second layer 314 using electroless deposition techniques. In one embodiment, the electroless deposition uses a gold cyanide solution to provide a chemical reaction that deposits the gold in the third layer 316. In one embodiment, the third layer 316 is deposited to a thickness of approximately 50-80 nm.

Embodiments of the interface layers 310 as described above include a number of advantages. As described above, embodiments of the second layer 314 are deposited with an amorphous microstructure that provides improved mechanical characteristics. Further, embodiments of the second layer 314 provide improved corrosion resistance. These and other characteristics of the interface layers 310 allow a thinner deposition of gold in the third layer 316 as described above. A thinner gold layer allows a substantial price reduction in a grid array connection structure. Further, a thin gold layer such as 50-80 nm provides a finer grain structure than previous thicker gold layer such as 350 nm or more. The finer grain structure of present embodiments further enhances mechanical properties such as high wear resistance.

Figure 3B:
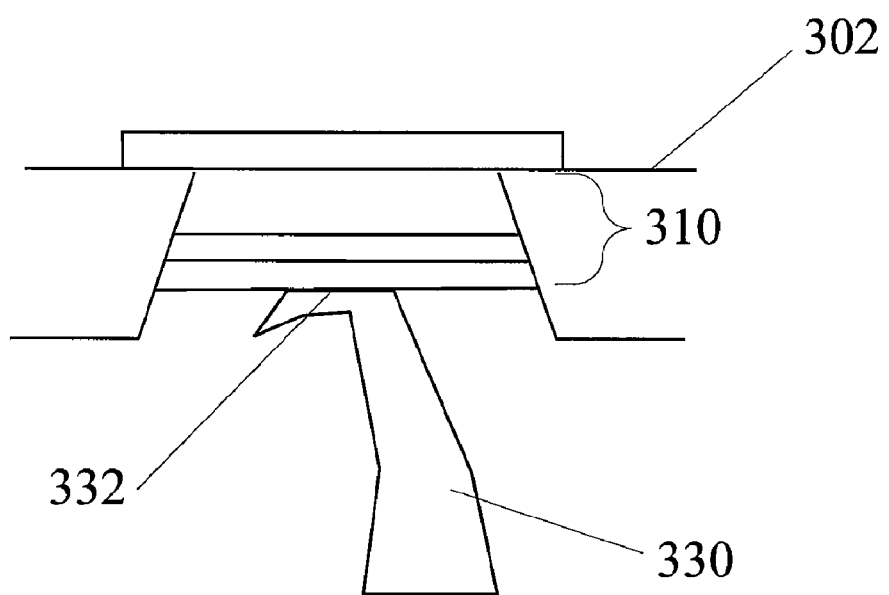
FIG. 3B illustrates an input/output interface according to one embodiment of the invention.

FIG. 3B shows an example of a pin 330 contacting the interface layers 310 of a grid connection structure 300 as described in embodiments above. A contact interface 332 is formed between the pin 330 and the interface layers 310 allowing electrical conduction and transfer of information from, for example, a chip package and a circuit board. Using embodiments of a grid connection structure 300 as described above, increase reliability is achieved due to improved mechanical characteristics such as wear resistance at the interface 332. Further, as described above, selected embodiments of the grid connection structure 300 are less expensive to manufacture due in part to a reduction in an amount of gold used in interface layers.

Figure 4:
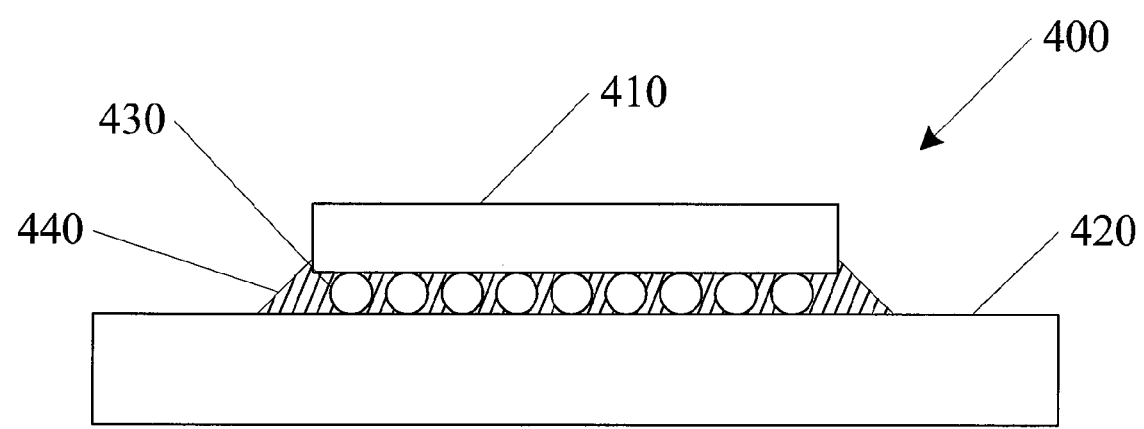
FIG. 4 illustrates a chip assembly according to one embodiment of the invention.

FIG. 4 shows a chip assembly 400. A chip package 410 is shown mounted to an adjacent circuit board 420. In one embodiment, as shown in FIG. 4, a ball grid array 430 forms a number of input/output connections located between the chip package 410 and the circuit board 420. In one embodiment, an underfill 440 is further included between the chip package 410 and the circuit board 420.

Figure 5A:
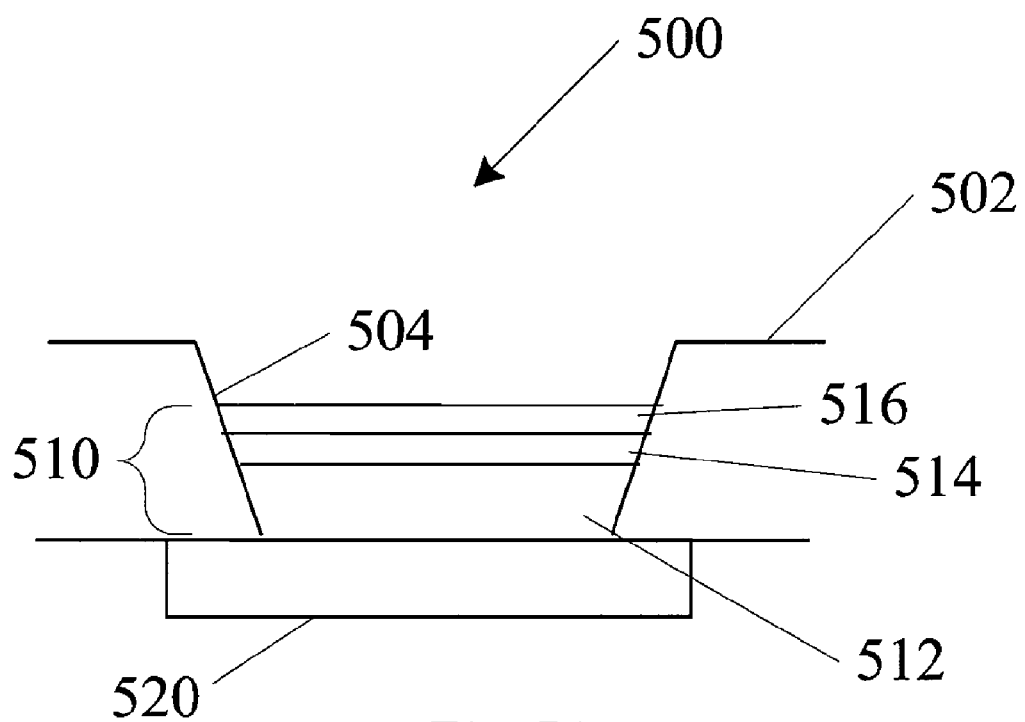
FIG. 5A illustrates an input/output structure in process according to one embodiment of the invention.

FIG. 5A shows a grid connection structure 500 during a manufacturing process. A portion of a chip package 502 is shown with an electrical connection structure 520. In one embodiment, the electrical connection structure 520 is located within an opening 504 in the chip package 502. In one embodiment, the electrical connection structure 520 includes a metallic connection surface, for example a copper or copper containing surface. Further shown in FIG. 5A are interface layers 510. A first layer 512, a second layer 514, and a third layer 516 are shown in FIG. 5A.

In one embodiment the first layer 512 includes nickel. In one embodiment the first layer 512 includes nickel and phosphorous. In one embodiment, the nickel in the first layer 512 is deposited on the electrical connection structure 520 using electroless deposition techniques. In one embodiment, the electroless deposition uses a chemical reaction to deposit the first layer 512, which results in an alloy of nickel and phosphorous deposited as the first layer 512. In one embodiment, the first layer is deposited to a thickness of between 5 and 8 µm.

In one embodiment, the second layer 514 includes palladium. In one embodiment, the second layer includes palladium and phosphorous. In one embodiment, the palladium in the second layer 514 is deposited on the first layer 512 using electroless deposition techniques. In one embodiment, the electroless deposition uses a chemical reaction to deposit the second layer 514, which results in an alloy of palladium and phosphorous deposited as the second layer 514.

In one embodiment, the second layer 514 is deposited to a thickness of approximately 30-100 nm. In one embodiment, the second layer 514 is substantially amorphous on a nanometer scale dimension. In one embodiment, the amorphous microstructure is substantially non-porous. A non-porous microstructure provides an advantage of a continuous barrier layer over underlying structure such as the first layer 512. Continuous, or non-porous layers help to prevent corrosion of underlying structure such as nickel in an embodiment of the first layer 512.

Figure 5B:
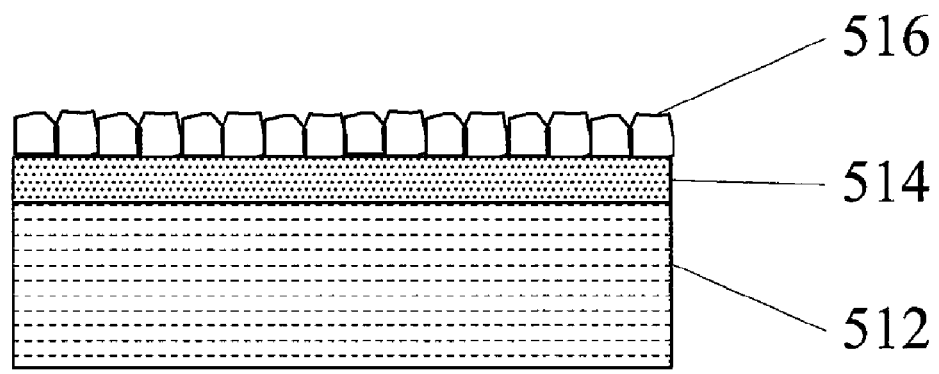
FIG. 5B illustrates a microstructure of a portion of an input/output structure in process according to one embodiment of the invention.

In one embodiment, the third layer 516 includes gold. In one embodiment, the gold in the third layer 516 is deposited on the second layer 514 using electroless deposition techniques. In one embodiment, the electroless deposition uses a gold cyanide solution to provide a chemical reaction that deposits the gold in the third layer 516. In one embodiment, the third layer 516 is deposited to a thickness of approximately 50-80 nm. FIG. 5B shows a close up view of a microstructure of the interfacial layers 510 as shown at the processing stage in FIG. 5A.

One advantage of deposition of a palladium second layer 514 between deposition of a gold third layer 516 and first layer 512 includes reduced corrosion. When a gold cyanide chemical deposition is used over nickel, the nickel tends to corrode and degrade quality in the interfacial layers 510. In contrast, electroless deposition of a palladium layer 514 over the nickel layer 512 does not lead to appreciable corrosion. Further, the palladium second layer 514 serves as a barrier layer during the gold third layer deposition, thus improving quality in the interfacial layers 510.

Figure 5C:
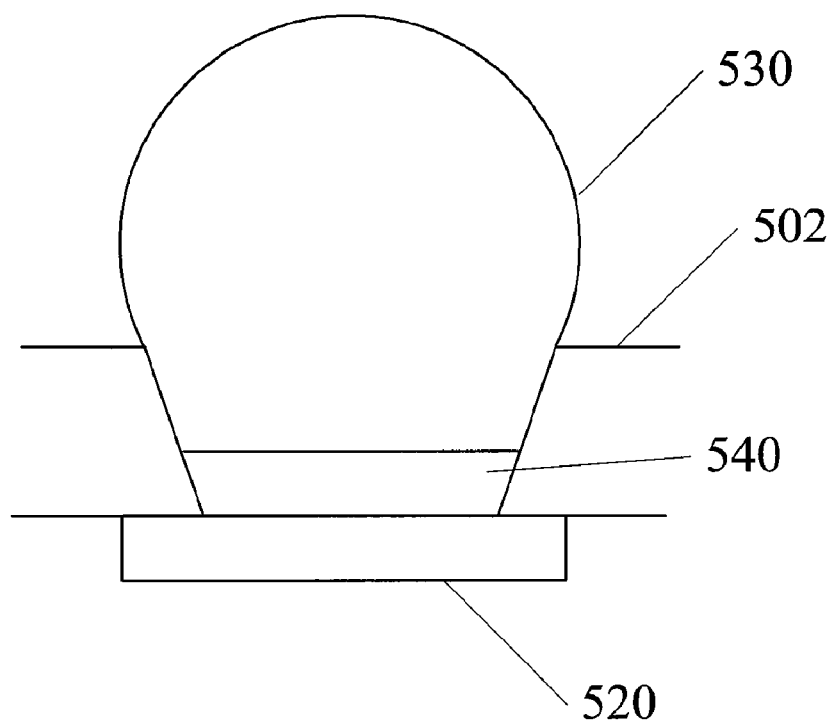
FIG. 5C illustrates an input/output structure according to one embodiment of the invention.

FIG. 5C shows a further stage of processing of the grid array connection structure 500. A solder structure 530 is deposited onto the interfacial layers 510 and the grid array connection structure 500 is reflowed to provide the structure as shown in FIG. 5C. In one embodiment, the solder structure 530 includes a solder ball, such as for use in a ball grid array. One of ordinary skill in the art, having the benefit of the present disclosure will recognize that embodiments having other solder structures such as pads, or other solder geometries are also within the scope of the invention. After the reflow process, a new interfacial region 540 is created due to material transport such as diffusion and chemical reactions taking place in the grid array connection structure 500.

Figure 5D:
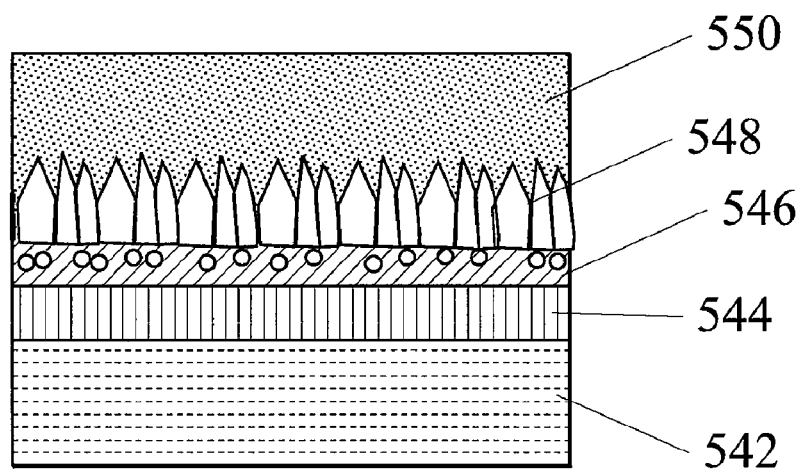
FIG. 5D illustrates a microstructure of a portion of an input/output structure according to one embodiment of the invention.

FIG. 5D shows a microstructure of the interfacial region 540 after reflow. A solder portion 550 is shown, that includes lead free solder in one embodiment. In several electronic device designs, lead free solder is being used for attachments such as chip package attachment to an adjacent circuit board. There are a number of reasons to use lead free solders, including environmental concerns to reduce lead waste. Although environmental concerns are addressed using lead free solder, other challenges arise in manufacturing and design, such as increased hardness and possible brittle failure of some lead free solders. In one embodiment, the lead free solder 550 includes a SnAgCu solder composition. In one embodiment, the SnAgCu solder includes Sn3.0 Ag0.5 Cu. In one embodiment, the SnAgCu solder includes any solder in a range between Sn3.0-4.0 Ag0.5 Cu where numeric values indicate percent by mass in the solder.

FIG. 5D also shows a first layer 542 which corresponds to the nickel first layer 512 discussed above. A second layer 544 is shown over the first layer 542. A third layer 546 is located over the second layer 544, and a fourth layer 548 is shown located between the third layer 546 and the solder portion 550.

In one embodiment, the first layer 542 is substantially the same composition as the first layer 512 before the reflow process. Similar to embodiments described above, in one embodiment, the first layer 542 includes nickel. In one embodiment, the first layer includes nickel and phosphorous, as deposited in a an electroless deposition method.

In one embodiment, the second layer 544 includes nickel, tin, and phosphorous (NiSnP). One of ordinary skill in the art, having the benefit of the present disclosure will recognize that while discrete layers and chemistries are labelled in the present figures for illustrative purposes, concentration gradients of various layer chemistries may not be discrete. In some embodiments, a concentration profile will vary across a layer as shown in the Figures due to reaction variables or transport kinetics, etc.

In one embodiment, the third layer 546 includes tin, nickel, copper, and phosphorous (SnNiCuP). In one embodiment the third layer 546 is an intermetallic layer formed during the reflow process. In one embodiment, the third layer 546 is located approximately where the second layer 514 from FIG. 5A was located before the reflow process. In one embodiment, the third layer 546 is formed by replacement of palladium by SnCu groups. In one embodiment, the palladium (Pd) from the second layer 514 diffuses into the solder portion 550 during the reflow process, leaving behind the third layer 546.

Although elements that are present are indicated in the description of the layers, the exact stoichiometry varies in some embodiments, unless otherwise noted. For example, although description of the third layer indicates that in one embodiment SnCu replaces palladium (Pd) during reflow, it is not necessary in all embodiments for only one atom of tin and one atom of copper to exactly replace one atom of palladium.

In one embodiment, the fourth layer 548 includes copper, nickel, and tin. In one embodiment the fourth layer 548 is an intermetallic layer formed during the reflow process. In one embodiment the fourth layer includes crystalline grains of $(CuNi)_6Sn_5$. In embodiments with crystalline grains, the stoichiometry of the grains is specific as indicated by the chemical notation $(CuNi)_6Sn_5$. In one embodiment the crystalline grains of $(CuNi)_6Sn_5$ are elongated as indicated in FIG. 5D. In one embodiment, elongated grains are formed due to the presence of the second layer 514 in the structure prior to reflow. In one embodiment, palladium controls the diffusion of nickel during reflow, resulting in a more elongated and finer grain structure than if the second layer 514 had not been present. One advantage of grain structures in the fourth layer 548 as described above includes improved mechanical properties such as hardness and tensile strength, etc. that result in a more robust grid connection structure 500.

Figure 6:
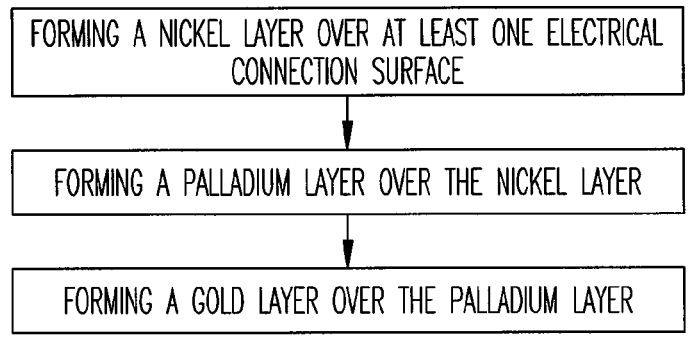
FIG. 6 illustrates a method of forming a grid array connection structure according to one embodiment of the invention.

FIG. 6 shows one example of a method of forming a grid array connection structure as described in embodiments above. In one operation, a nickel layer is formed over at least one electrical connection surface. In another operation, a palladium layer is formed over the nickel layer. In another operation, a gold layer is formed over the palladium layer. Additional method operations follow in selected embodiments as described above. For example, in a land grid array example, a pin is brought into contact with the gold layer, and improved properties such as hardness and wear resistance provide a more robust land grid array connection. In another example, a solder structure is further formed over the gold layer, and the structure is reflowed to create a ball grid array structure. Improved properties such as corrosion resistance and grain structure provide a more robust ball grid array structure.

Figure 7:
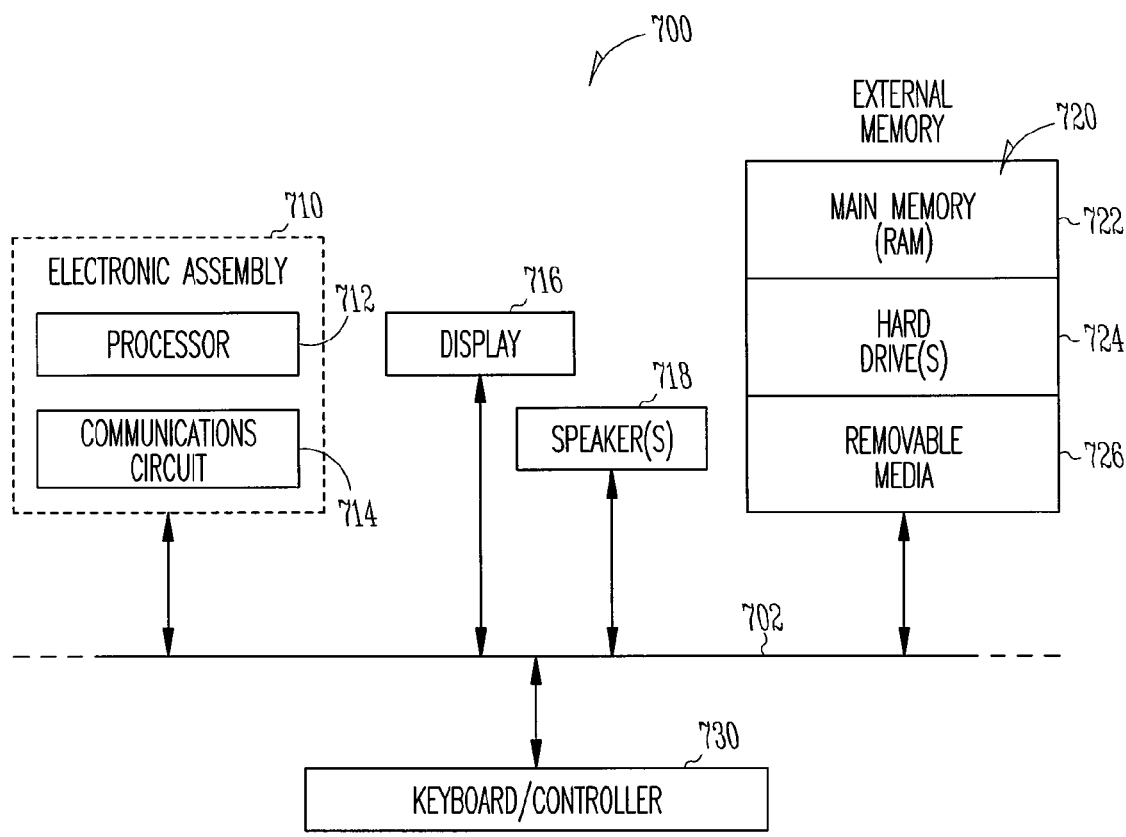
FIG. 7 illustrates an electronic system according to one embodiment of the invention.

An example of an information handling system using processor chips is included to show an example of a higher level device application for the present invention. FIG. 7 is a block diagram of an information handling system 700 incorporating at least one electronic assembly 710 utilizing an input/output connection structure in accordance with at least one embodiment of the invention. In one embodiment, the input/output connection includes a land grid array connection. In one embodiment, the input/output connection includes a ball grid array connection.

Information handling system 700 is merely one example of an electronic system in which the present invention can be used. In this example, the information handling system 700 includes a data processing system that includes a system bus 702 to couple the various components of the system. System bus 702 provides communications links among the various components of the information handling system 700 and can be implemented as a single bus, as a combination of busses, or in any other suitable manner.

Electronic assembly 710 is coupled to system bus 702. Electronic assembly 710 can include any circuit or combination of circuits. In one embodiment, electronic assembly 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 710 are a custom circuit, an application-specific integrated circuit (ASIC), or the like, such as, for example, one or more circuits (such as a communications circuit 714) for use in wireless devices like cellular telephones, pagers, portable computers, two-way radios, and similar electronic systems. The IC can perform any other type of function.

Information handling system 700 can also include an external memory 720, which in turn can include one or more memory elements suitable to the particular application, such as a main memory 722 in the form of random access memory (RAM), one or more hard drives 724, and/or one or more drives that handle removable media 726 such as compact disks (CD), digital video disk (DVD), and the like. Examples of main memory 722 include dynamic random access memory (DRAM), synchronous dynamic random access memory (SDRAM), flash memory, static random access memory (SRAM), etc.

Information handling system 700 can also include a display device 716, one or more speakers 718, and a keyboard and/or controller 730, which can include a mouse, trackball, game controller, voice-recognition device, or any other device that permits a system user to input information into and receive information from the information handling system 700.

Devices and methods described above provide a number of advantages. For example, land grid array structures are described with improved mechanical properties such as hardness and abrasion resistance. Land grid array structures are also shown that are less expensive to manufacture due to reductions in material cost such as gold. Ball grid array structures are also described with improved resistance to corrosion during fabrication. Ball grid array structures are also described with improved mechanical properties to provide improved joint interface strength in solder joints such as lead free solder joints.

Although selected advantages are detailed above, the list is not intended to be exhaustive. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of embodiments described above. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A semiconductor chip grid array connection structure, comprising:
    a metallic electrical connection surface;
    a nickel layer coupled to the connection surface;
    a solder structure;
    a SnNiCuP layer between the nickel layer and the solder structure; and
    a $(CuNi)_6Sn_5$ intermetallic layer between the SnNiCuP layer and the solder structure.

2. The connection structure of claim 1, wherein solder in the solder structure includes Sn3Ag0.5Cu.

3. The connection structure of claim 1, wherein solder in the solder structure includes Sn4Ag0.5Cu.

4. The connection structure of claim 1, wherein the metallic electrical connection surface includes a copper connection surface.

5. The connection structure of claim 1, wherein the nickel layer includes nickel and phosphorous.

6. The connection structure of claim 1, wherein the solder structure includes a ball grid array solder ball.

7. The connection structure of claim 1, wherein the solder structure contains palladium.

* * * * *